US010910458B2

(12) United States Patent
Matsueda et al.

(10) Patent No.: US 10,910,458 B2
(45) Date of Patent: Feb. 2, 2021

(54) DISPLAY APPARATUS

(71) Applicant: TIANMA JAPAN, LTD., Kanagawa (JP)

(72) Inventors: Yojiro Matsueda, Kawasaki (JP); Kenichi Takatori, Kawasaki (JP)

(73) Assignee: TIANMA MICROELECTRONICS CO., LTD., Shenzhen (CN)

(*) Notice: Subject to any disclaimer, the term of this patent is extended or adjusted under 35 U.S.C. 154(b) by 115 days.

(21) Appl. No.: 15/667,723

(22) Filed: Aug. 3, 2017

(65) Prior Publication Data

US 2018/0040684 A1   Feb. 8, 2018

(30) Foreign Application Priority Data

Aug. 5, 2016   (JP) ................. 2016-155048

(51) Int. Cl.
*H01L 27/32* (2006.01)
*H01L 51/52* (2006.01)
(Continued)

(52) U.S. Cl.
CPC ...... *H01L 27/3276* (2013.01); *H01L 51/5237* (2013.01); *H01L 27/124* (2013.01);
(Continued)

(58) Field of Classification Search
CPC .............. H01L 27/124; H01L 27/3276; H01L 27/1255; H01L 51/5203; H01L 51/5237; H01L 51/56
See application file for complete search history.

(56) References Cited

U.S. PATENT DOCUMENTS 9,984,635 B2 * 5/2018 Lee ................. G09G 3/3611
2008/0266210 A1   10/2008 Nonaka
(Continued)

FOREIGN PATENT DOCUMENTS

JP   2008-216894 A   9/2008
JP   2008-292995 A   12/2008
(Continued)

OTHER PUBLICATIONS

Office Action dated Mar. 24, 2020 in Japanese Application No. 2016-155048.

*Primary Examiner* — Kenneth Bukowski
(74) *Attorney, Agent, or Firm* — Sughrue Mion, PLLC

(57) ABSTRACT

A display apparatus includes: pixels arrayed in a non-rectangular display region in a first direction and a second direction; a scan line extending in the first direction and connected to a first pixel group extending in the first direction; an intersecting scan line including a first wiring and a second wiring, the first wiring extending in the first direction and connected to a second pixel group extending in the first direction, the second wiring extending in the second direction; a data line extending in the second direction and connected to a third pixel group extending in the second direction; a scan circuit group in a first side portion of an outer circumferential side of the display region and facing the scan line, and configured to output a scan signal to the scan line and to output a scan signal to the first wiring via the second wiring; and a data signal circuit group in a second side portion of the outer circumferential side and facing the first side portion, and configured to output a data signal to the data line.

18 Claims, 13 Drawing Sheets

(51) Int. Cl.
*H01L 27/12* (2006.01)
*H01L 51/56* (2006.01)

(52) U.S. Cl.
CPC ...... *H01L 27/1255* (2013.01); *H01L 51/5203* (2013.01); *H01L 51/56* (2013.01)

(56) References Cited

U.S. PATENT DOCUMENTS

| | | |
|---|---|---|
| 2010/0171687 A1* | 7/2010 | Chiang ................ G09G 3/3648 345/98 |
| 2010/0177069 A1 | 7/2010 | Park et al. |
| 2010/0188375 A1 | 7/2010 | Lee et al. |
| 2011/0050741 A1 | 3/2011 | Jeong |
| 2012/0139820 A1 | 6/2012 | Senda et al. |
| 2013/0044095 A1* | 2/2013 | Heo .................... H01L 27/3276 345/211 |
| 2014/0043306 A1 | 2/2014 | Min et al. |
| 2016/0125793 A1* | 5/2016 | Kim ........................ G09G 3/20 345/213 |
| 2016/0372533 A1* | 12/2016 | Kim .................... H01L 27/3272 |
| 2017/0084225 A1* | 3/2017 | Nam .................... G09G 3/2085 |

FOREIGN PATENT DOCUMENTS

| | | |
|---|---|---|
| JP | 2010-122461 A | 6/2010 |
| JP | 2010-164937 A | 7/2010 |
| JP | 5308990 B2 | 7/2013 |
| JP | 5371519 B2 | 9/2013 |
| JP | 5832757 B2 | 11/2015 |

\* cited by examiner

DISPLAY APPARATUS

CROSS-REFERENCE TO RELATED APPLICATIONS

This non-provisional application claims priority under 35 U.S.C. § 119(a) on Patent Application No. 2016-155048 filed in Japan on Aug. 5, 2016, the entire contents of which are hereby incorporated by reference.

TECHNICAL FIELD

The present disclosure relates to a display apparatus.

BACKGROUND

In recent years, a display apparatus having a non-rectangular display region such as a circular display region has been commercialized (Japanese Patent Laid-Open Publication No. 2008-292995). In major display apparatuses having the non-rectangular display region, a partial driver which uses a demultiplexer (DeMUX) is incorporated. In the partial driver-incorporated display apparatus, a DeMUX circuit and a scan driver circuit are disposed in an outer circumference of a display panel that forms the display apparatus.

In a display apparatus having a non-rectangular display region, the DeMUX circuit and the scan driver circuit are sometimes disposed in a partial region of the outer circumference in a concentrated manner. The partial region is a region of the outer circumference of the display region in which a driver IC is disposed. As a result, a bezel width corresponding to the region widens. On the other hand, it is desirable to narrow the bezel width so that the display region is relatively large.

SUMMARY

A display apparatus according to one aspect of the present disclosure comprises a plurality of pixels arrayed in a non-rectangular display region in a first direction and a second direction; one or more scan lines extending in the first direction and connected to a first pixel group extending in the first direction; one or more intersecting scan lines including a first wiring and a second wiring, the first wiring extending in the first direction and connected to a second pixel group extending in the first direction, the second wiring extending in the second direction; one or more data lines extending in the second direction and connected to a third pixel group extending in the second direction; a scan circuit group in a first side portion of an outer circumferential side of the display region and facing the scan line, and configured to output a scan signal to the scan line and to output a scan signal to the first wiring via the second wiring of the intersecting scan line; and a data signal circuit group in a second side portion of the outer circumferential side and facing the first side portion, and configured to output to the data line a data signal corresponding to an emission luminance of a pixel to which the scan signal is input.

It is to be understood that both the foregoing general description and the following detailed description are exemplary and explanatory and are not restrictive of the invention.

The above and further objects and features will more fully be apparent from the following detailed description with accompanying drawings.

DETAILED DESCRIPTION

Embodiment 1

Hereinafter, embodiments will be described in detail with reference to the drawings. Ordinal numbers such as "first" and "second" in the specification and the claims are used to clarify the relation between components and to prevent confusion between components. Therefore, these ordinal numbers do not limit the number of components.

A non-rectangular shape indicates a shape other than a rectangular shape (quadrangle). The non-rectangular shape includes a triangle and a polygon having a number of angles equal to or larger than a number of angles of a pentagon. The non-rectangular shape also includes a circular shape, an elliptical shape, a star shape, a heart shape, and a wedge shape.

In the following description, a display apparatus having a circular display region as an example of a non-rectangular display region will be described. Particularly, an OLED (organic light emitting diode) display apparatus which uses an OLED as a light emitting device will be described.

Figure 1:
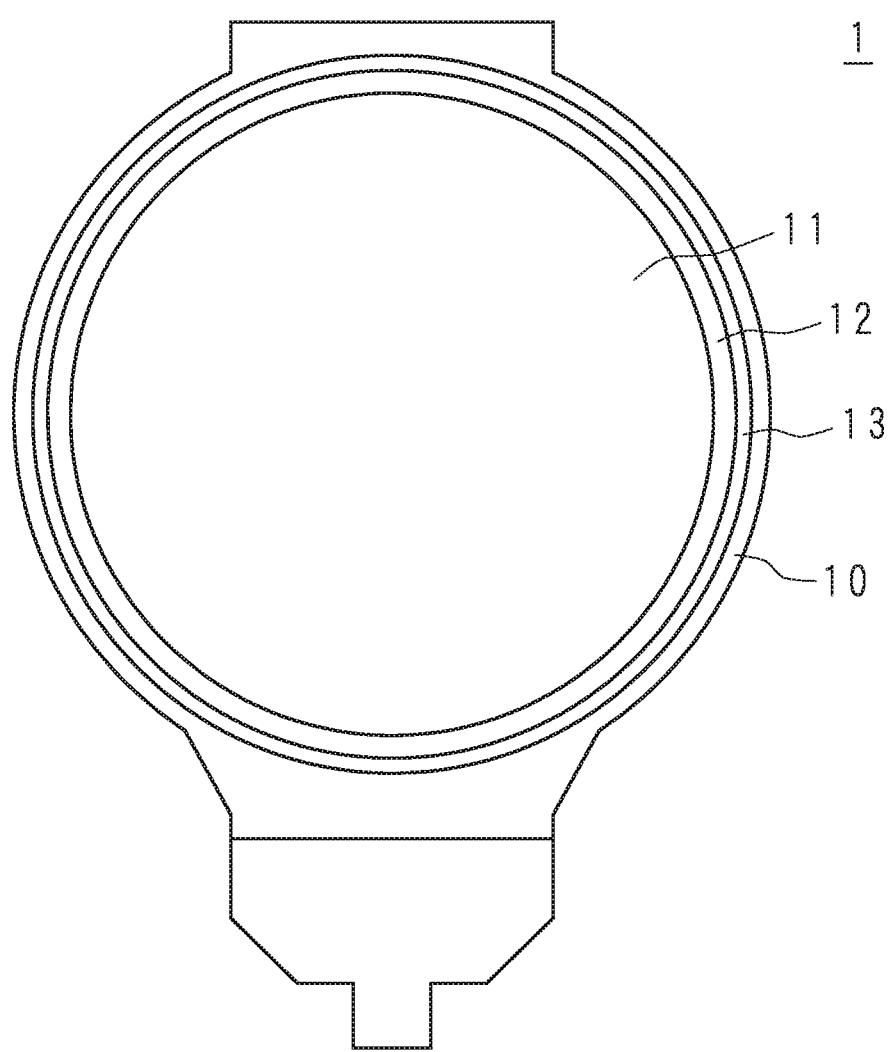
FIG. 1 is a plan view illustrating an appearance of a display apparatus.

FIG. 1 is a plan view illustrating an appearance of a display apparatus 1. The display apparatus 1 comprises a substrate 10, a display section 11, and a driver IC 14. The substrate 10 is a transparent substrate such as a glass substrate. The display section 11 is formed on the substrate 10. A thin film transistor (TFT) circuit arrangement region 12 is provided along an outer circumferential edge of the display section 11. A glass frit seal portion 13 is provided along an outer circumferential edge of the TFT circuit arrangement region 12.

Figure 2:
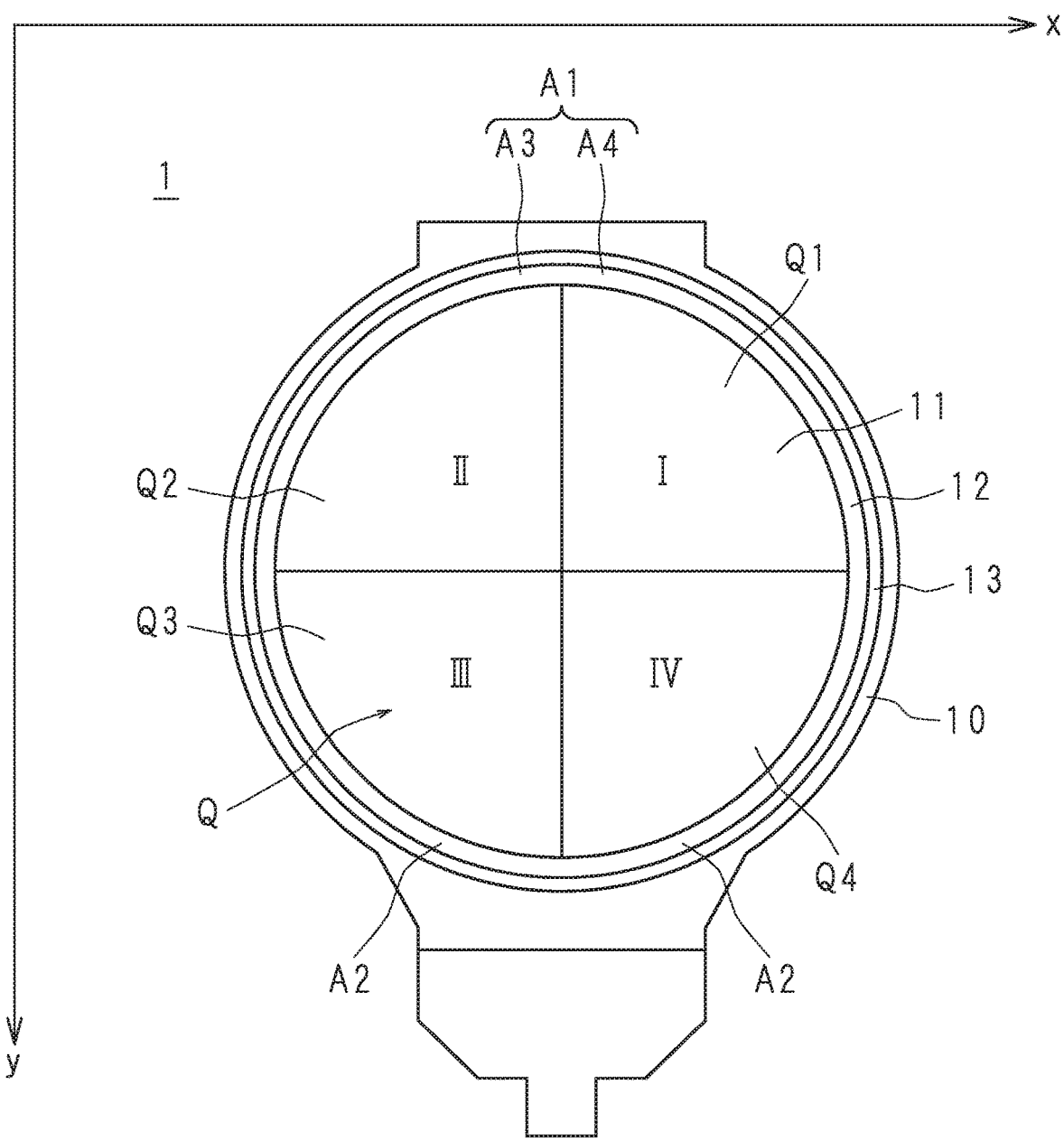
FIG. 2 is an explanatory diagram illustrating definitions of directions and quadrants.

FIG. 2 is an explanatory diagram illustrating definition of directions and quadrants. In the following description, two directions of the display apparatus 1 will be defined. Moreover, four regions Q1 to Q4 are defined for a display region Q of the display section 11. Furthermore, four regions are defined for the TFT circuit arrangement region 12. As illustrated in FIG. 2, two orthogonal axes are defined in a plan parallel to the display region of the display section 11. The two axes are an X-axis and a Y-axis. An X-axis direction is a first direction. A Y-axis direction is a second direction. Extending in the first direction means to be parallel to the first direction, for example. Extending in the second direction means to be parallel to the second direction, for example.

As illustrated in FIG. 2, a quadrant defined for the display section 11 is divided into four regions by two imaginary lines. One imaginary line is a line along the first direction. The other imaginary line is a line along the second direction. Two imaginary lines cross each other at the center of the display section 11. The four regions are defined as a first quadrant Q1, a second quadrant Q2, a third quadrant Q3, and a fourth quadrant Q4 in a counter-clockwise direction from the top-right.

As illustrated in FIG. 2, an outer circumferential side of the TFT circuit arrangement region 12 is divided into four regions (substantially three regions). A partial region of the TFT circuit arrangement region 12 positioned in an outer circumferential side of the first and second quadrants Q1 and Q2 of the display section 11 is a first side portion A1. A partial region of the TFT circuit arrangement region 12 positioned in an outer circumferential side of the third and fourth quadrants Q3 and Q4 of the display section 11 is referred to as a second side portion A2. Moreover, the first side portion A1 is further divided into two regions. A region of the first side portion A1 positioned closer to the outer circumferential side of the second quadrant Q2 is referred to as a third side portion A3. A region of the first side portion A1 positioned closer to the outer circumferential side of the first quadrant Q1 is referred to as a fourth side portion A4.

Figure 3:
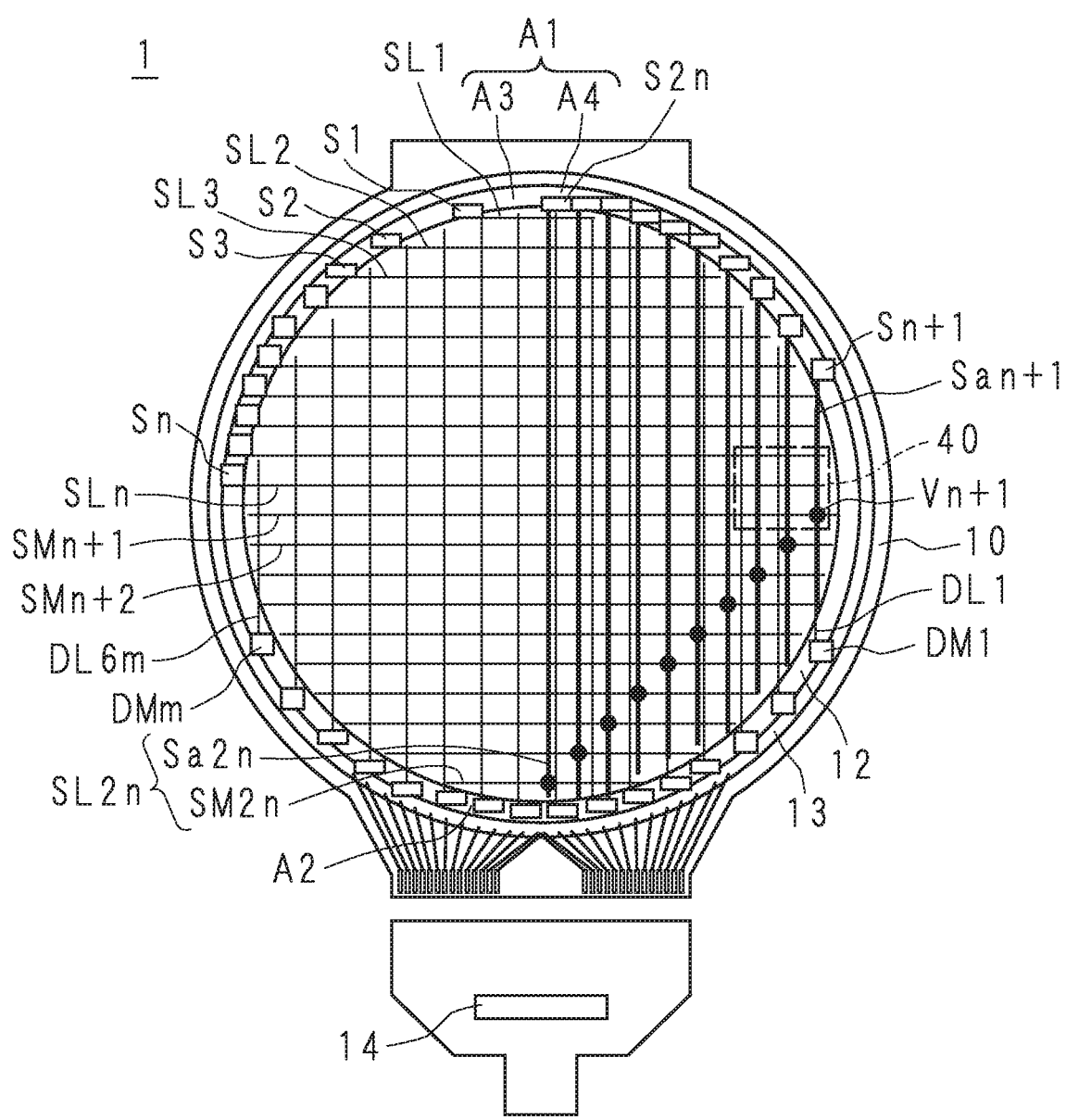
FIG. 3 is a plan view illustrating an arrangement example of scan lines and data lines.
Figure 4:
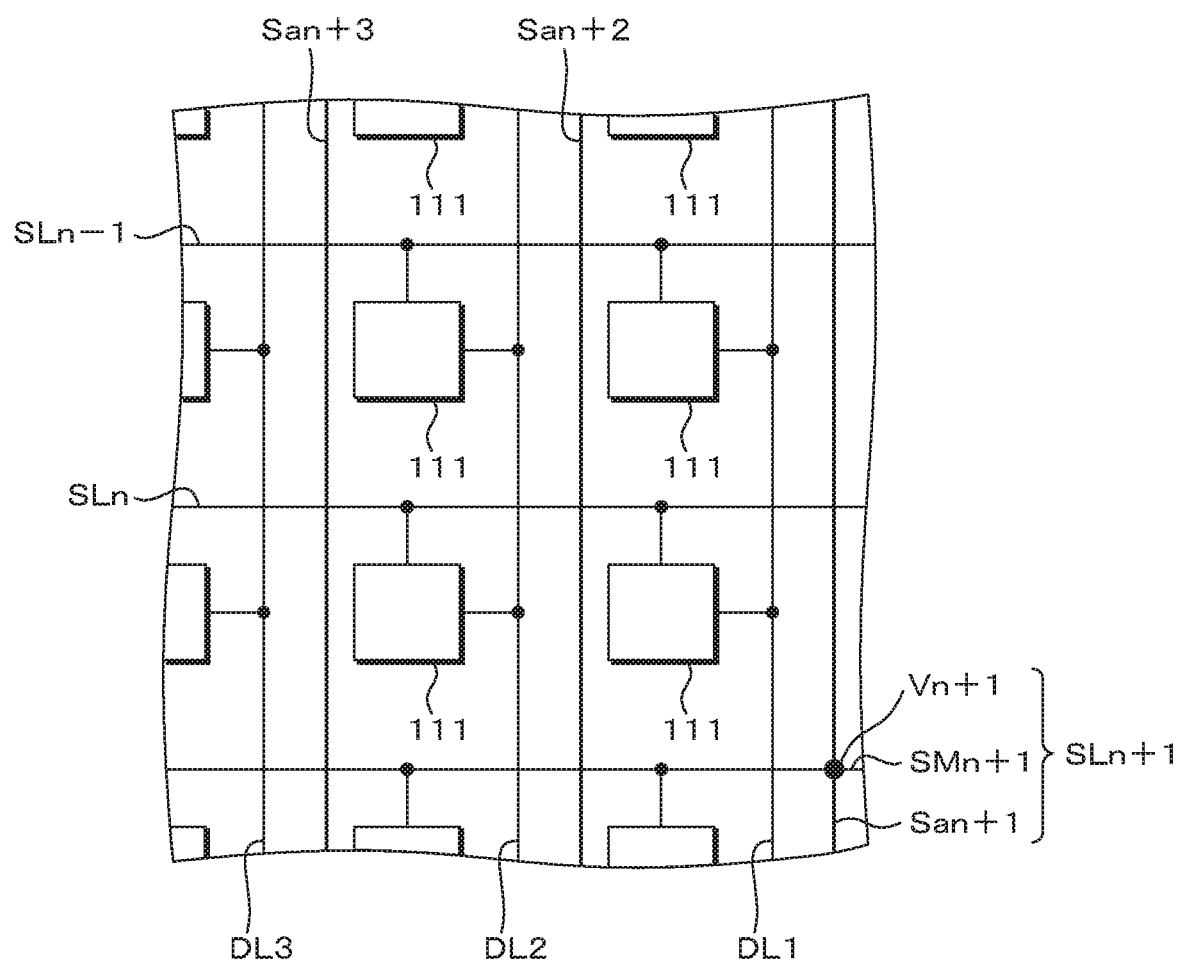
FIG. 4 is a partial enlarged view of FIG. 3.
Figure 5A:
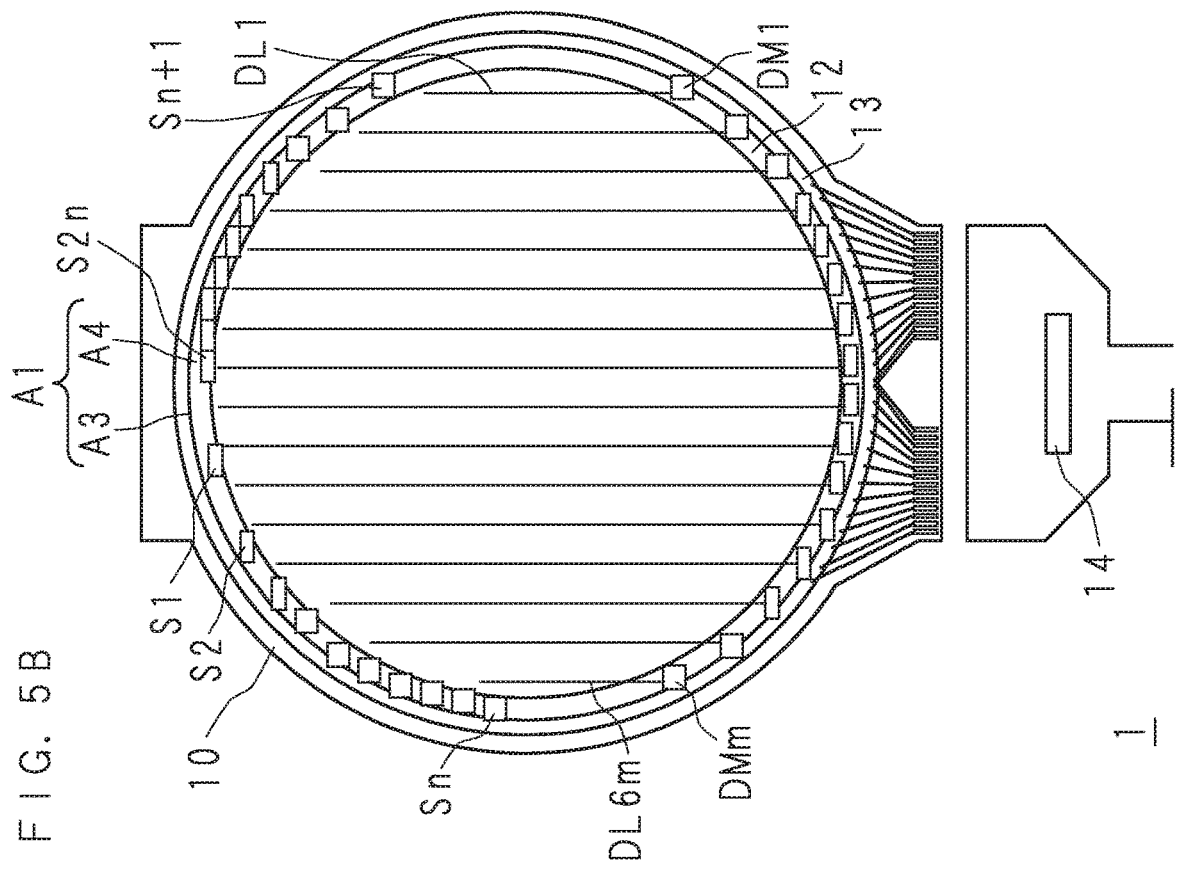
FIG. 5A is a plan view illustrating an arrangement example of scan lines.
Figure 5B:
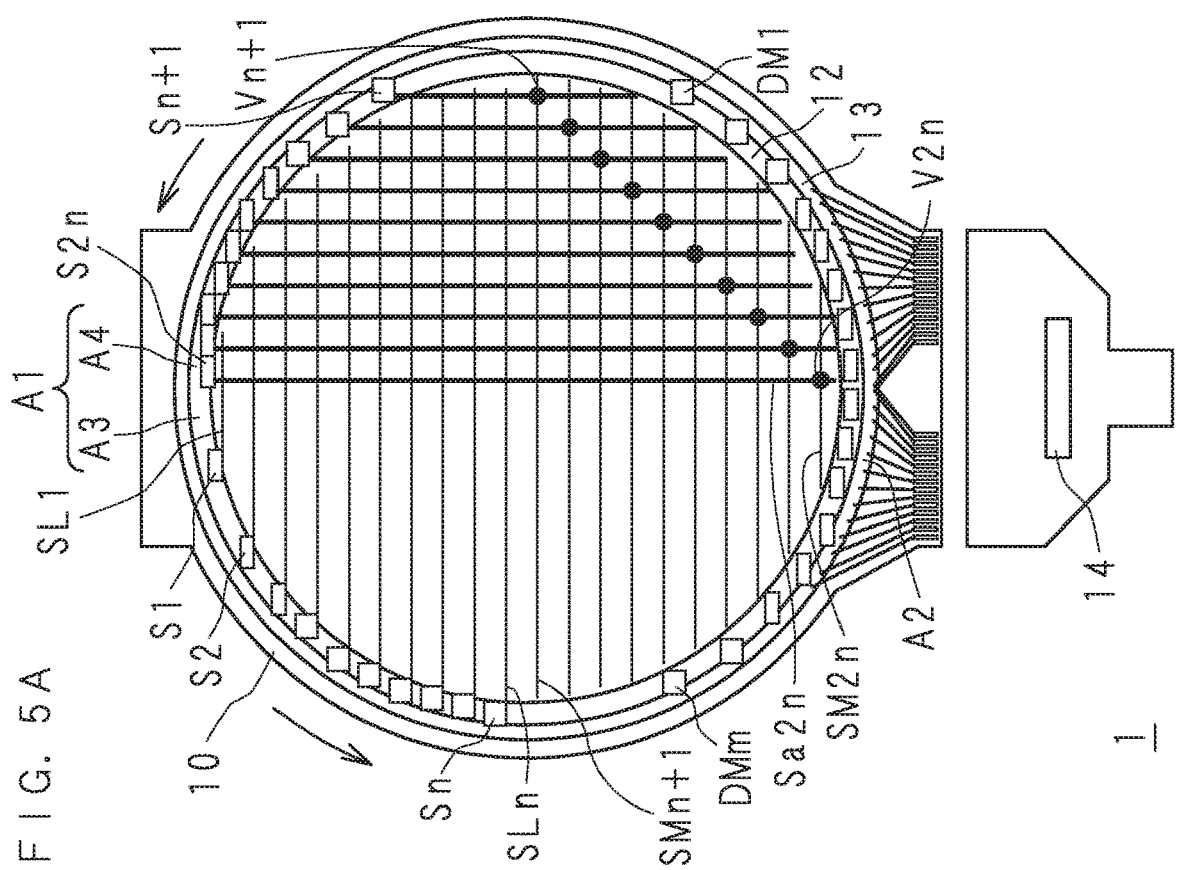
FIG. 5B is a plan view illustrating an arrangement example of data lines.

FIG. 3 is a plan view illustrating an arrangement example of scan lines and data lines. FIG. 4 is a partial enlarged view of FIG. 3. FIG. 4 is an enlarged view of a region 40 illustrated in FIG. 3. FIG. 5A is a plan view illustrating an arrangement example of scan lines. FIG. 5B is a plan view illustrating an arrangement example of data lines. As illustrated in FIG. 4, the display section 11 of the display apparatus 1 has a plurality of pixels 111 arrayed in the X-axis direction and the Y-axis direction. The plurality of pixels 111 are arrayed in a matrix form. A largest number of pixels 111 arrayed in a row direction is 6m (m is an integer of 2 or more). A largest number of pixels 111 arrayed in a column direction is 2n (n is an integer of 1 or more). The first direction is the row direction. The second direction is the column direction. The largest number of pixels 111 arrayed in the row direction is 6m and the largest number of pixels 111 arrayed in the column direction is 2n. However, this is an example and the number is not limited thereto. The largest number of pixels arrayed in the row direction may not be multiples of 6. The largest number of pixels arrayed in the column direction may not be multiples of 2.

2n scan driver blocks S1 to S2n are disposed in the TFT circuit arrangement region 12 of the display apparatus 1. The 2n scan driver blocks S1 to S2n are disposed in the first side portion A1 which is the outer circumferential side of the first and second quadrants Q1 and Q2. n scan driver blocks S1 to Sn among the 2n scan driver blocks S1 to S2n are disposed in the third side portion A3 which is the outer circumferential side of the second quadrant Q2. The remaining n scan driver blocks Sn+1 to S2n are disposed in the fourth side portion A4 which is the outer circumferential side of the first quadrant Q1. The scan driver blocks S1 to S2n are an example of a scan circuit group.

m data driver blocks DM1 to DMm are disposed in the TFT circuit arrangement region 12. The data driver blocks DM1 to DMm are an example of a data signal circuit group that outputs a data signal corresponding to an emission luminance of a pixel to which a scan signal is input to data lines DL1 to DL6m. m data driver blocks DM1 to DMm are disposed in the second side portion A2 which is an outer circumferential side of the third and fourth quadrants Q3 and Q4. The data lines DL1 to DL6m extend in the second direction. Each of the data lines DL1 to DL6m is connected to the plurality of pixels (third pixel group) that extends in the second direction.

n scan lines SL1 to SLn extending in the first direction are disposed in the display section 11. The scan lines SL1 to SLn are disposed adjacent to each other in the second direction. Adjacent two scan lines among the scan lines SL1 to SLn are disposed at a predetermined interval. The scan lines SL1 to SLn are connected to scan driver blocks S1 to Sn, respectively. The scan driver blocks S1 to Sn output a scan signal to the scan lines SL1 to SLn, respectively. Scanning is performed in the order of SL1, SL2, SL3, . . . , and SLn. Therefore, the scan signal is output to the scan driver blocks S1, S2, S3, . . . , and Sn in that order. The scan lines SL1 to SLn are connected to the plurality of pixels (first pixel group) extending in the first direction.

n first wirings SMn+1 to SM2n extending in the first direction are disposed in the display section 11. The first wirings SMn+1 to SM2n are disposed adjacent to each other in the second direction. Adjacent two first wirings of the first wirings SMn+1 to SM2n are disposed at a predetermined interval. The first wiring SMn+1 is disposed next to the scan line SLn. The first wiring SMn+1 is the longest among the first wirings SMn+1 to SM2n. The first wiring SMn+2 is shorter than the first wiring SMn+1. The first wiring SMn+3 is shorter than the first wiring SMn+2. The first wirings SMn+1 to SM2n are shorter sequentially in this order in the second direction. Moreover, the first wiring SM2n is the shortest. Each of the first wirings SMn+1 to SM2n is connected to the plurality of pixels (second pixel group) extending in the first direction.

n second wirings San+1 to Sa2n extending in the second direction are disposed in the display section 11. The second wirings San+1 to Sa2n are disposed adjacent to each other in the first direction in the order of the second wiring Sa2n, the second wiring Sa2n−1, . . . , and the second wiring San+1. Adjacent two second wirings of the second wirings San+1 to Sa2n are disposed at a predetermined interval. The second wiring Sa2n is the longest among the second wirings San+1 to Sa2n. The second wiring Sa2n−1 is shorter than the second wiring Sa2n. The second wiring Sa2n−2 is shorter than the second wiring Sa2n-1. The second wirings Sa2n to San+1 are shorter sequentially in this order in the first direction. Moreover, the second wiring San+1 is the shortest.

The first wirings SMn+1 to SM2n are electrically connected to the second wirings San+1 to Sa2n by connection portions Vn+1 to V2n, respectively. Here, the first wiring SMn+1 and the second wiring San+1 connected by the connection portion Vn+1 are collectively referred to as an intersecting scan line SLn+1. Therefore, n intersecting scan lines SLn+1 to SL2n are disposed in the display section 11. The second wirings San+1 to Sa2n are connected to the scan driver blocks Sn+1 to S2n, respectively. The scan driver blocks Sn+1 to S2n output a scan signal to the first wirings SMn+1 to SM2n via the second wirings San+1 to Sa2n, respectively.

The intersecting scan line SLn+1 includes the first wiring SMn+1 and the second wiring San+1. The intersecting scan line SLn+2 includes the first wiring SMn+2 and the second wiring San+2. The first wiring SMn+2 is shorter than the first wiring SMn+1. In contrast, the second wiring San+2 is longer than the second wiring San+1. The respective differences are approximately the same. Similarly, in adjacent two different intersecting scan lines, the difference value between the first wirings and the difference value between the second wirings are approximately the same. As a result, the entire lengths of the wirings of the intersecting scan lines SLn+1 to SL2n are approximately the same.

The intersecting scan line SLn+1 is referred to as a first intersecting scan line, the intersecting scan line SLn+2 is referred to as a second intersecting scan line, and the intersecting scan line SL2n is referred to as a n-th intersecting scan line. The length of the second wiring San+i of the i-th intersecting scan line (i is an integer of 1 or more and smaller than n+1) is shorter than the second wiring San+i+1 of the (i+1)th intersecting scan line, and the length of the first wiring SMn+i of the i-th intersecting scan line is longer than the first wiring SMn+i+1 of the (i+1)th intersecting scan line.

First to p-th scan lines are disposed in the first and second quadrants of the display apparatus 1. An example of the first to p-th scan lines is the scan lines SL1 to SLn. The first wirings of the first to q-th intersecting scan lines are disposed in the third and fourth quadrants. An example of the first to q-th intersecting scan lines is the intersecting scan lines SLn+1 to SL2n.

Figure 6:
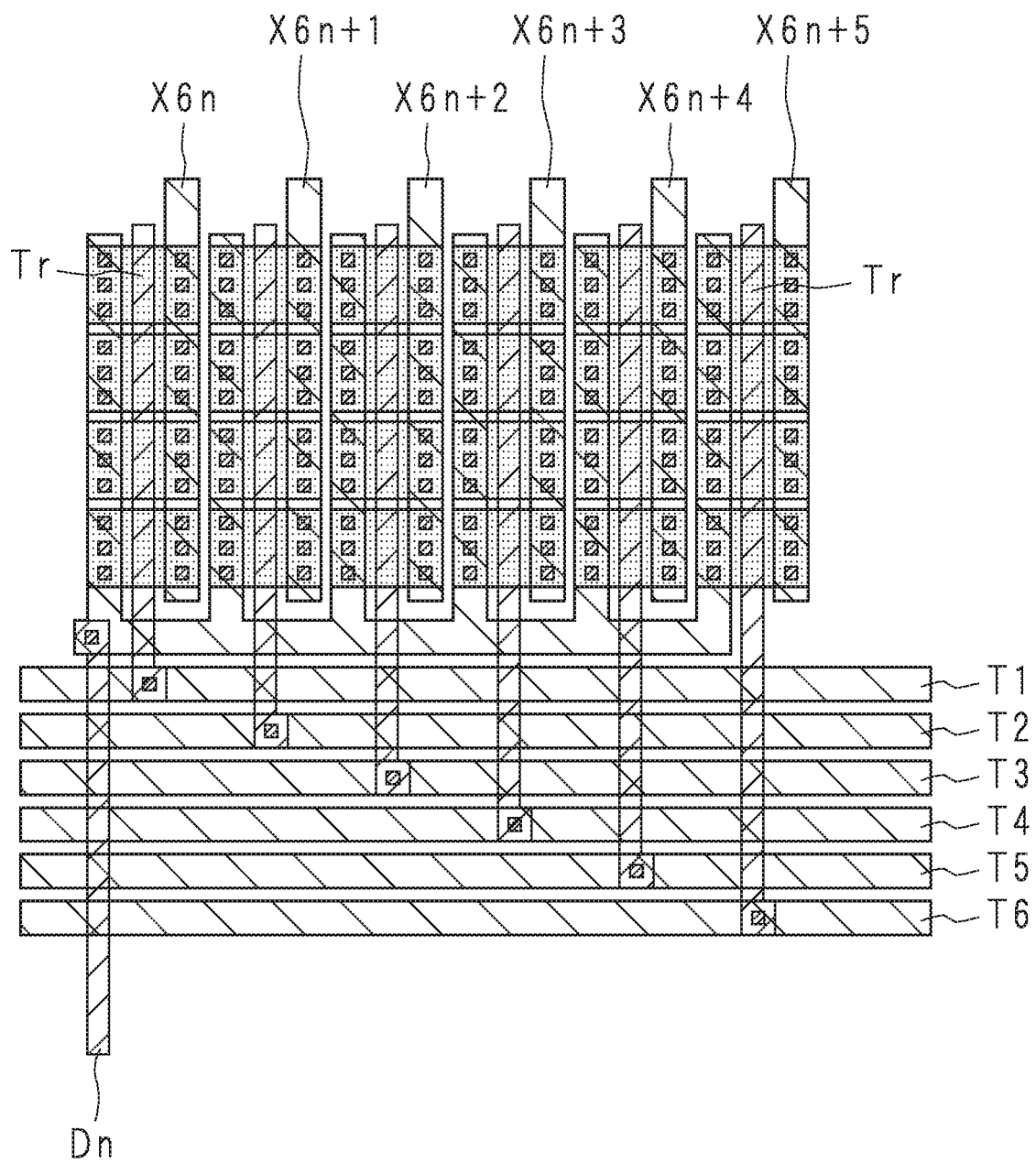
FIG. 6 is a circuit block diagram illustrating a configuration example of a data driver block.

FIG. 6 is a circuit block diagram illustrating a configuration example of the data driver blocks DM1 to DMm. The data driver blocks DM1 to DMm are circuit blocks that include a demultiplexer that distributes a data signal output by the driver IC 14. Dn is an input wiring to which the data signal output by the driver IC 14 is input. X6n to X6n+5 are output wirings of the data signal. The demultiplexer illustrated in FIG. 6 is a 1:6 demultiplexer that distributes one input to six outputs. Control input wirings T1 to T6 are provided in the demultiplexer. The demultiplexer includes switching transistors Tr. The switching transistors Tr correspond to output wirings and control input wirings. The source and the drain of each switching transistor Tr are connected to the input wiring Dn of the data signal. The control input wirings T1 to T6 are connected to the gates of the switching transistors Tr. The drain and the source of each switching transistor Tr are connected to the output wirings X6n to X6n+5. One of the switching transistors Tr is turned on by a signal from the control input wirings T1 to T6. The demultiplexer outputs an input data signal from the output wiring corresponding to the switching transistor Tr that is turned on.

In FIG. 3 and FIGS. 5A and 5B, only one data line drawn from each of the data driver blocks DM1 to DMm is illustrated. As described above, since the data driver blocks DM1 to DMm include the 1:6 demultiplexer, each of the data driver blocks DM1 to DMm is connected to six data lines. In the present embodiment, the m data driver blocks are present, and 6m data lines are therefore provided in the entire display section 11.

In the demultiplexer illustrated in FIG. 6, a thin film transistor (TFT) which uses low temperature poly-silicon (LTPS) is used as the switching transistor Tr. Moreover, the TFT in the demultiplexer illustrated in FIG. 6 has a two-layer metal structure.

As illustrated in FIG. 6, each of the data driver blocks DM1 to DMm includes at least one input wiring, six output wirings, and six control input wirings. Due to such a configuration, a number of wirings are present around the data driver blocks DM1 to DMm. Therefore, similarly to the display apparatus of the related art, a sufficient TFT circuit arrangement region 12 for arranging the data driver block and the scan driver block is necessary in order to arrange the same adjacent to each other. In contrast, in the display apparatus 1 of the present embodiment, the scan driver blocks S1 to Sn are disposed in the first side portion A1. Moreover, the scan driver blocks Sn+1 to S2n are also disposed in the first side portion A1. Such an arrangement is made possible by configuring the scan lines connected to the scan driver blocks Sn+1 to S2n as the intersecting scan lines. On the other hand, the data driver blocks DM1 to DMm are disposed in the second side portion A2 that faces the first side portion A1. Due to such a configuration, it is possible to reduce the region for arranging the scan driver blocks S1 to S2n and the data driver blocks DM1 to DMm.

Figure 7:
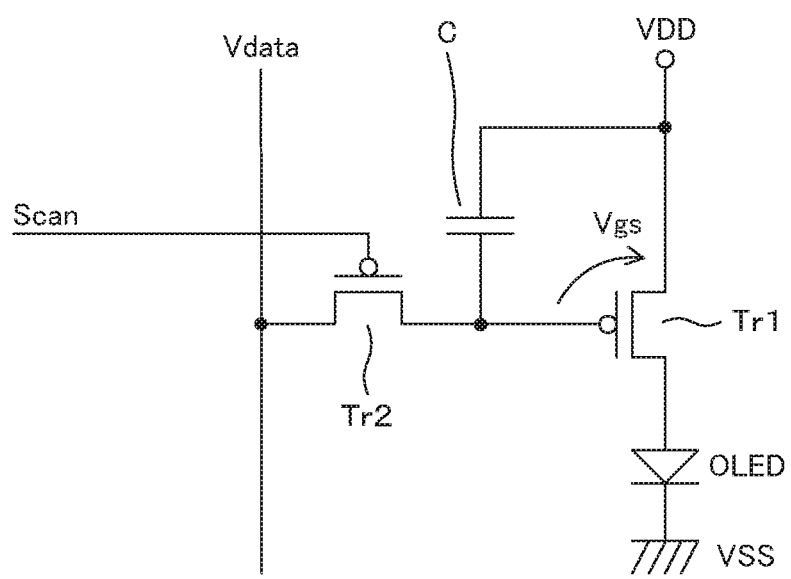
FIG. 7 is a circuit diagram illustrating an example of a pixel circuit included in a pixel.

FIG. 7 is a circuit diagram illustrating an example of a pixel circuit included in the pixel 111. The pixel circuit includes an OLED, a driving transistor Tr1, a switching transistor Tr2, and a retention capacitor C. An output voltage of a positive voltage source VDD, an output voltage of a negative voltage source VSS, a video signal Vdata, and a scan signal Scan are input to the pixel circuit. The video signal Vdata is output from each of the data driver blocks DM1 to DMm to a corresponding pixel circuit. The scan signal Scan is output from each of the scan driver blocks S1 to S2n to a corresponding pixel circuit. The video signal Vdata is input to a source electrode of the switching transistor Tr2. The scan signal Scan is input to a gate electrode of the switching transistor Tr2. The positive voltage source VDD is connected to a first electrode of the retention capacitor C and a source electrode of the driving transistor Tr1. The negative voltage source VSS is connected to a cathode electrode of the OLED. A drain electrode of the switching transistor Tr2 is connected to a second electrode of the retention capacitor C and a gate electrode of the driving transistor Tr1. A drain electrode of the driving transistor Tr1 is connected to an anode electrode of the OLED.

A voltage corresponding to the scan signal Scan and the video signal Vdata is applied to each pixel circuit. When a scan line is selected by any one of the scan driver blocks S1 to S2n (that is, when the scan signal Scan becomes ON), the switching transistor Tr2 is turned ON and a voltage corresponding to the video signal Vdata is output from the drain electrode of the switching transistor Tr2.

The driving transistor Tr1 supplies to the OLED a current corresponding to a potential difference Vgs between the output voltage of the drain electrode of the switching transistor Tr2 and the output voltage of the positive voltage source VDD. As a result, the OLED emits light with a luminance proportional to the current. After the scan signal Scan becomes OFF, the potential difference Vgs of the driving transistor Tr1 is maintained by charges stored in the retention capacitor C and the OLED continues emitting light.

Figure 8:
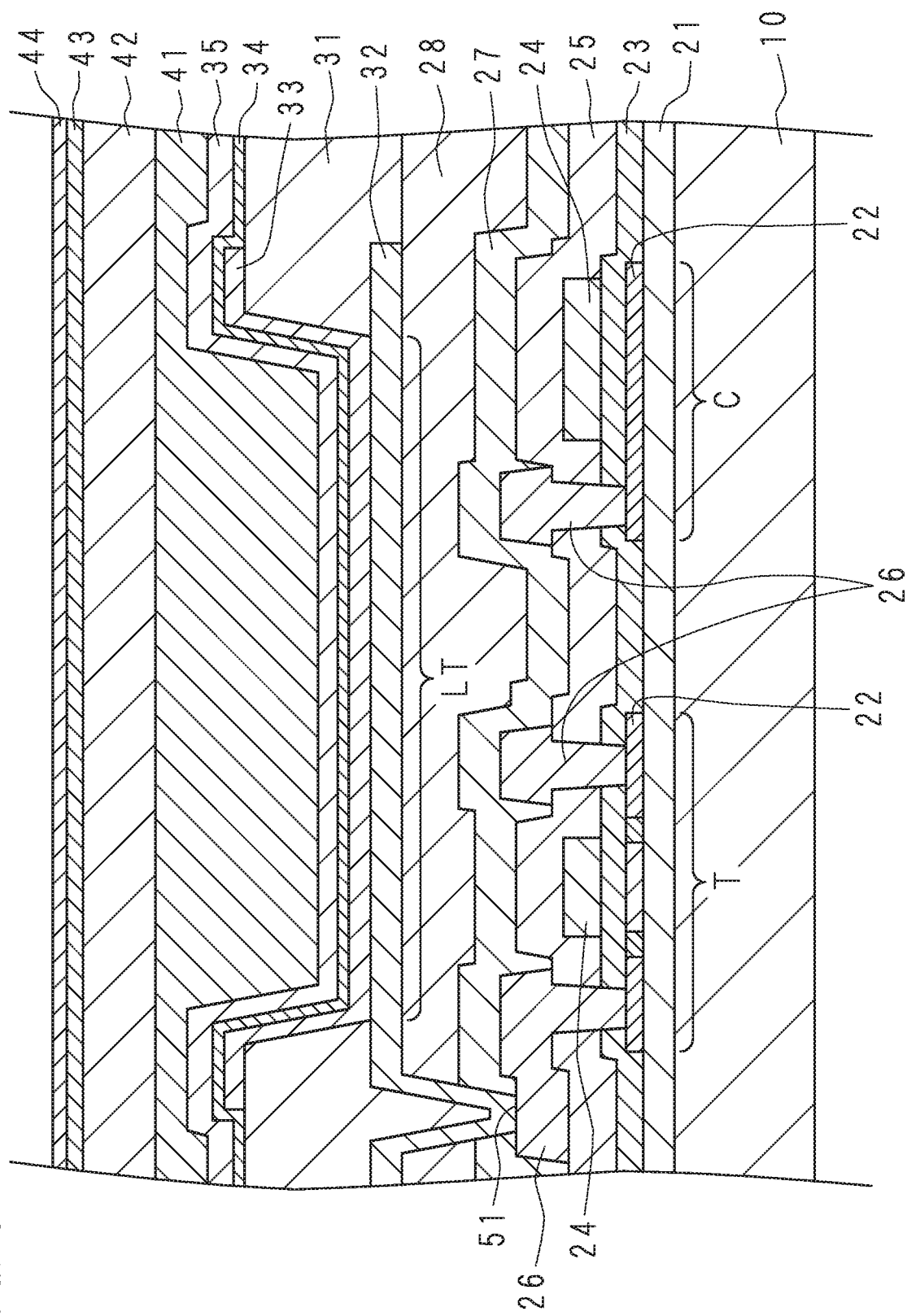
FIG. 8 is an example of a cross-sectional view of a display section.

FIG. 8 illustrates an example of a cross-sectional view of the display section 11. FIG. 8 is a cross-sectional view of a portion of the display section 11 including one OLED element LT, taken along a plane vertical to an image display surface. A transistor T is formed in a left-bottom part of FIG. 8. A retention capacitor C is formed in a right-bottom part of FIG. 8. The OLED element LT is formed on the transistor T and the retention capacitor C. The cross-section illustrated herein shows a layer structure in which the transistor T, the retention capacitor C, and the OLED element LT are formed. The transistor T is a driving transistor Tr1 that drives the OLED element LT, for example.

An underlying insulating film 21 is stacked on a substrate 10. A polysilicon layer 22 is formed on the underlying insulating film 21. A gate insulating film 23 is formed on the polysilicon layer 22. A first metal layer 24 is stacked on the gate insulating film 23. The first metal layer 24 is formed of molybdenum (Mo) or the like. An interlayer insulating film 25 is stacked on the first metal layer 24. A second metal layer 26 is stacked on the interlayer insulating film 25. The second metal layer 26 is formed of a high melting point metal such as molybdenum (Mo) or the like. A portion of the second metal layer 26 is physically and electrically connected to the polysilicon layer 22 via a contact hole. A passivation film 27 is formed on the second metal layer 26. The passivation film 27 is an inorganic insulating film. A planarization film 28 is stacked on the passivation film 27.

An anode electrode 32, an OLED device 33, a cathode electrode 34, and a cap layer 35 are stacked on the planarization film 28. The anode electrode 32 is connected to a TFT circuit output connection portion 51. The TFT circuit output connection portion 51 is connected to the drain and the source of the transistor T. An element separation film 31 is formed between a portion of each of the planarization film 28 and the anode electrode 32 and a portion of each of the OLED device 33 and the cathode electrode 34. The element separation film 31 is an organic film. The element separation film 31 is an insulating layer having a rectangular hole. The element separation film 31 covers edges of the TFT circuit output connection portion 51 and the anode electrode 32 but does not cover a central portion of the anode electrode 32.

A sealing glass 42 is disposed above the cap layer 35 with an air gap 41 interposed therebetween. A quarter wavelength retardation plate 43 and a polarization plate 44 are disposed on the sealing glass 42.

The OLED element LT includes a portion of the anode electrode 32, which is not covered by the element separation film 31, and the OLED device 33, the cathode electrode 34, and the cap layer 35 which are stacked on the upper side thereof.

The upper sides of the central portion of the anode electrode 32 and an edge of the hole formed in the element separation film 31 are covered by the OLED device 33. The OLED device 33 is a layer of an organic composition that emits light of any one of first, second, and third colors when a voltage is applied thereto.

The display apparatus 1 comprises a plurality of pixels. A pixel includes a light emitting device including an organic light emitting layer and a pixel circuit including a capacitor and a driving transistor that causes a current corresponding to a voltage of the capacitor to flow into the light emitting device. An example of the light emitting device is the OLED element LT. An example of the capacitor is the retention capacitor C. An example of the driving transistor is the driving transistor Tr1.

The cathode electrode 34 is provided on the upper side of the OLED device 33. The cathode electrode 34 is a transparent electrode that continuously covers the OLED elements LTs included in the display section 11. That is, the cathode electrode 34 is an electrode which is provided commonly for adjacent OLED elements LTs.

The cap layer 35 is provided on the upper side of the cathode electrode 34. The cap layer 35 is a layer that continuously covers the OLED elements LTs similarly to the cathode electrode 34. The cap layer 35 is a layer formed of a transparent material having a high refractive index.

Dry air is sealed in the air gap 41. The cap layer 35, the air gap 41, and the sealing glass 42 function as a protection layer that prevent the cathode electrode 34 of the OLED device 33 from deteriorating due to moisture and from being broken by external force.

The pixel circuit of the display apparatus 1 is formed in a layer form on the substrate, and the light emitting device is formed on an upper side of a layer of which the pixel circuit is formed.

The display section 11 illustrated in FIG. 8 has a two-layer metal structure including two metal layers. In the two-layer metal structure illustrated in FIG. 8, the scan lines SL1 to SLn are formed of the first metal layer 24. The first wirings SMn+1 to SM2n of the intersecting scan lines SLn+1 to SL2n are also formed of the first metal layer 24. The second wirings San+1 to Sa2n of the intersecting scan lines SLn+1 to SL2n are formed of the second metal layer 26. The data lines DL1 to DL6m are formed of the second metal layer 26.

In the two-layer metal structure illustrated in FIG. 8, the retention capacitor C has the same structure as the transistor T. The retention capacitor C is a so-called MOS capacitor. An upper electrode of the retention capacitor C and the gate electrode of the transistor T are formed of the same first metal layer 24. A lower electrode of the retention capacitor C and a channel layer of the transistor T are formed of the same polysilicon layer 22. The polysilicon layer 22 that forms the lower electrode of the retention capacitor C is an impurity-doped layer.

In the two-layer metal structure, the second wirings and the data lines are formed in a wiring layer in which a wiring connected to at least one of the source and the drain included in the driving transistor is formed. An example of the wiring layer is the second metal layer 26. Moreover, the scan lines and the first wirings are formed in a layer in which the metal electrode of the capacitor is formed. An example of the layer in which the metal electrode of the capacitor is formed is the first metal layer 24.

In the two-layer metal structure illustrated in FIG. 8, it is necessary to add impurities to the polysilicon layer 22 before forming the first metal layer 24 after forming the polysilicon layer 22. When a process of adding impurities is performed after forming the first metal layer 24, impurities are not added to a portion of the polysilicon layer 22 covered by the first metal layer 24. The portion of the polysilicon layer 22 to which impurities are not added forms an intrinsic semiconductor. The intrinsic semiconductor has a high resistance. Due to such a configuration, the retention capacitor C does not function.

The gate insulating film 23 has a predetermined thickness or larger. This is because, when the gate insulating film 23 is thin, the gate electrode and the channel layer are electrically connected and the transistor T does not function.

The present embodiment provides the following advantages. The scan driver blocks S1 to S2n are disposed in the first side portion A1. On the other hand, the data driver blocks DM1 to DMm are disposed in the second side portion A2 that faces the first side portion A1. In this manner, the scan driver blocks S1 to S2n and the data driver blocks DM1 to DMm are disposed in different regions. That is, in the present embodiment, the driver blocks are disposed evenly around the display screen so that the driver blocks are suppressed from being disposed in a partial region (the region close to the driver IC 14) in a concentrated manner. Specifically, the data driver blocks DM1 to DMm are disposed in a region close to the driver IC 14, and the scan driver blocks S1 to S2n are not disposed in this region. Due to such a configuration, the arrangement region of the driver blocks in this region can be narrowed, and it is therefore possible to further narrow the bezel width of the display apparatus 1.

The entire lengths of the wirings of the intersecting scan lines SLn+1 to SL2n are approximately the same. Due to this, a variation in wiring capacitance of the intersecting scan lines SLn+1 to SL2n is small. Therefore, the pixels 111 connected to the intersecting scan lines SLn+1 to SL2n can be driven under the same conditions.

Embodiment 2

Figure 9:
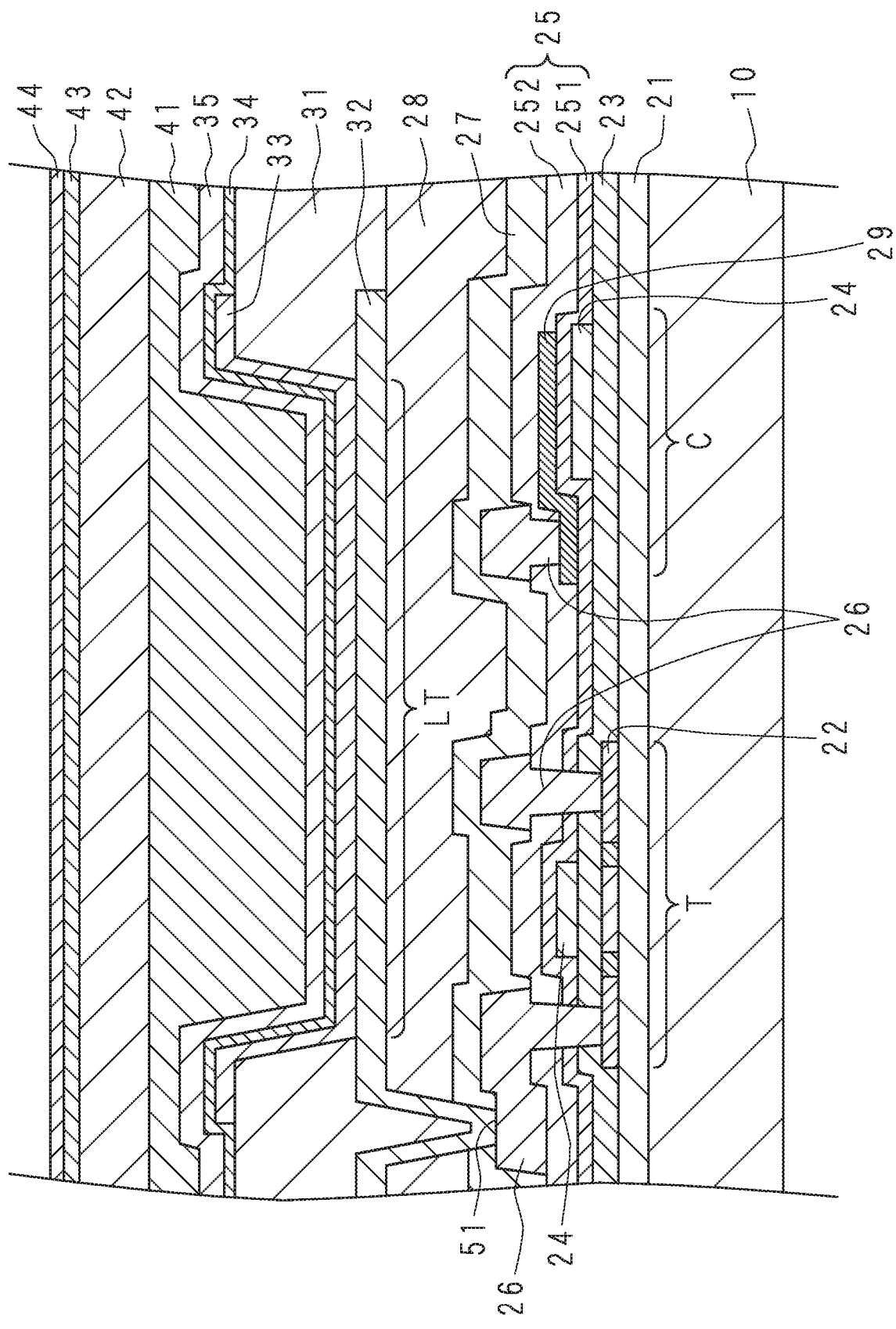
FIG. 9 is an example of a cross-sectional view of a display section.

In Embodiment 2, the display section 11 is formed in a three-layer metal structure. The three-layer metal structure is a structure including three metal layers. FIG. 9 illustrates an example of a cross-sectional view of the display section 11. The same constituent elements as those of Embodiment 1 will be denoted by the same reference numerals and the description thereof will be omitted.

In the present embodiment, the interlayer insulating film 25 formed on the first metal layer 24 includes two layers of a first interlayer insulating film 251 and a second interlayer insulating film 252. A third metal layer 29 is formed between the first interlayer insulating film 251 and the second interlayer insulating film 252. The third metal layer 29 is formed of molybdenum (Mo) or the like. A portion of the third metal layer 29 forms the upper electrode that faces the lower electrode of the retention capacitor C.

In the present embodiment, the scan lines SL1 to SLn are formed of the first metal layer 24. The first wirings SMn+1 to SM2n of the intersecting scan lines SLn+1 to SL2n are also formed of the first metal layer 24. The second wirings San+1 to Sa2n of the intersecting scan lines SLn+1 to SL2n are formed of the third metal layer 29. The data lines DL1 to DL6m are formed of the second metal layer 26.

In the three-layer metal structure, the data lines are formed in a wiring layer in which a wiring connected to at least one of the source and the drain included in the driving transistor is formed. An example of the wiring layer is the second metal layer 26. The scan lines and the first wirings are formed in a layer in which the first metal electrode of the capacitor is formed. An example of the layer in which the first metal electrode of the capacitor is formed is the first metal layer 24. The second wirings are formed in a layer in which the second metal electrode of the capacitor is formed. An example of the layer in which the second metal electrode of the capacitor is formed is the third metal layer 29.

The present embodiment provides the following advantages in addition to the advantages provided by Embodiment 1. The retention capacitor C includes the first metal layer 24, the third metal layer 29, and the first interlayer insulating film 251. In order to allow the driving transistor Tr1 to function properly, the interlayer insulating film 25 needs to have a predetermined thickness or larger. In the present embodiment, the interlayer insulating film 25 includes the first interlayer insulating film 251 and the second interlayer insulating film 252. Due to such a configuration, by increasing the thickness of the second interlayer insulating film 252, it is possible to decrease the thickness of the first interlayer insulating film 251. The retention capacitor C may endure the voltage applied as a data signal. Due to this, the first interlayer insulating film 251 can have a minimum necessary thickness. As a result, it is possible to increase the capacitance per unit area of the retention capacitor C. As a result, it is possible to decrease an area necessary for forming the retention capacitor C. Therefore, an area necessary for forming the pixel circuit decreases. Therefore, it is possible to increase a resolution of the display section 11.

Since the number of metal layers is increased from two layers to three layers, the number of layers in which wirings are disposed increases. Therefore, more complex circuits than two layers can be created in the same area as two layers.

The data lines DL1 to DL6m are formed of the second metal layer 26. This is because, when the source and the drain of the switching transistor Tr2 are formed of the second metal layer 26, the data lines DL1 to DL6m connected to the source and the drain are formed of the same metal layer. As a result, it is easy to design wirings. Moreover, since the data lines are formed of the same layer, it is possible to shorten the wirings to the switching transistor Tr2 and to reduce a delay time of data.

The second wirings San+1 to Sa2n of the intersecting scan lines SLn+1 to SL2n are formed of the third metal layer 29. The third metal layer 29 can have a wiring resistance equivalent to that of the first metal layer 24. Since the wiring lengths of the intersecting scan lines SLn+1 to SL2n are approximately the same, it is possible to make the delay time uniform. When the delay time varies from scan line to scan line, a punch-through voltage occurring when a switching transistor for writing data in a pixel is turned off depends on the length of the delay time. The potential difference Vgs that determines a current amplification factor of the driving transistor Tr1 that supplies a current to an OLED changes depending on a difference in the delay time. As a result, the luminance of the display screen becomes uneven.

Embodiment 3

The present embodiment relates to a configuration for a smooth continuous operation of the scan driver blocks S1 to S2n. As described above, the scan driver blocks S1 to S2n sequentially outputs a scan signal. As the scan driver block, a shift register-type scan driver block is generally used, and an output signal of a previous-stage scan driver block is an input signal of a subsequent-stage scan driver block.

In the above-described embodiment, the scan driver blocks S1 to Sn are arranged in the output order of a scan signal, and the scan driver blocks of which the orders are one after another are adjacent to each other. Similarly, the scan driver blocks Sn+1 to S2n are arranged in the output order of a scan signal, and the scan driver blocks of which the orders are one after another are adjacent to each other. The scan driver block S2n of which the output order of the scan signal is the last is adjacent to the scan driver block S1 of which the order is the first. Therefore, it is easy to connect these scan driver blocks such that the output signal becomes an input signal of the subsequent stage.

However, the scan driver block Sn and the scan driver block Sn+1 are positioned to face each other with the display section 11 interposed therebetween. Due to such a configuration, a long wiring is necessary to be disposed in the circumference in order to deliver a scan signal. As a result, this long wiring is a large burden in wiring design of the display section 11. The present embodiment provides countermeasures for this problem.

Figure 10:
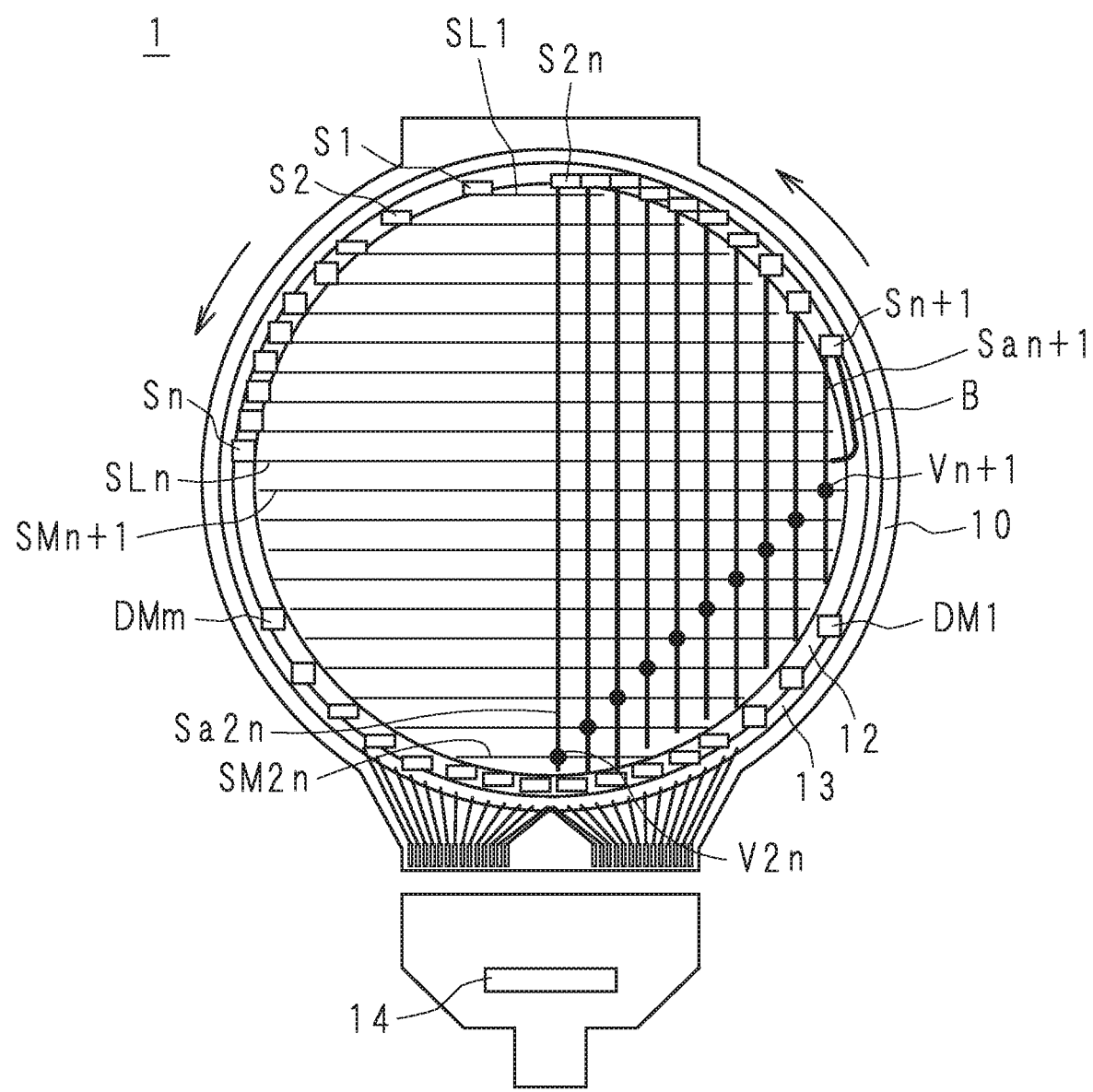
FIG. 10 is a plan view illustrating an arrangement example of scan lines.

FIG. 10 is a plan view illustrating an arrangement example of scan lines. In FIG. 10, data lines are not illustrated. In FIG. 10, the same constituent elements as those of the above-described embodiments will be denoted by the same reference numerals and the description thereof will be omitted. In the present embodiment, a scan signal is delivered from the scan driver block Sn to the scan driver block Sn+1 using the scan line SLn. A coupling wiring B for coupling the scan line SLn and the scan driver block Sn+1 is provided. One end of the scan line SLn is connected to the scan driver block Sn. The other end of the scan line SLn is located at a relatively close position to the scan driver block Sn+1. Therefore, it is easy to secure a region for the coupling wiring B.

In the display apparatus 1, a scan circuit that outputs a scan signal to the p-th scan line outputs a timing signal indicating a scan start timing via the p-th scan line to a scan circuit that outputs a scan signal to the first intersecting scan line. An example of the p-th scan line is the scan line SLn. An example of the scan circuit that outputs the scan signal to the p-th scan line is the scan driver block Sn. An example of the scan circuit that outputs the scan signal to the first intersecting scan line is the scan driver block Sn+1.

In the present embodiment, the scan line SLn is used for delivering signals from the scan driver block Sn to the scan driver block Sn+1. Due to this, it is possible to save another wiring for delivering the scan signal.

Embodiment 4

The present embodiment relates to eliminating a variation in delay time. In the display apparatus 1, a switching transistor (the switching transistor Tr2 in FIG. 7) of a pixel circuit is turned on at a rise of a scan signal, and charges corresponding to a voltage of a data signal are stored in a retention capacitor. Here, a delay occurs until the switching transistor is turned on after the scan signal rises. Here, a period of this delay is referred to as the delay time. The reason why the delay time occurs is because the scan line becomes longer as the size and the resolution of the display apparatus 1 increase. Moreover, the scan line intersects many signal lines. Due to this, since the ON resistance and the parasitic capacitance of the switching transistor increase, the waveform of the scan signal input to the gate of the switching transistor becomes blunt. As a result, the delay time occurs.

In the above-described embodiment, the lengths of the scan lines SL1 to SLn connected to the scan driver blocks S1 to Sn increase gradually. Due to this, the wiring capacitance increases and the delay time tends to increase gradually. On the other hand, since the intersecting scan lines SLn+1 to SL2n connected to the scan driver blocks Sn+1 to S2n have approximately the same length, it is possible to suppress a change in the delay time.

Therefore, in the present embodiment, wirings extending in the second direction similarly to the intersecting scan lines SLn+1 to SL2n are also added to the scan driver blocks S1 to Sn. In this way, the lengths of all scan lines are uniform.

Figure 11:
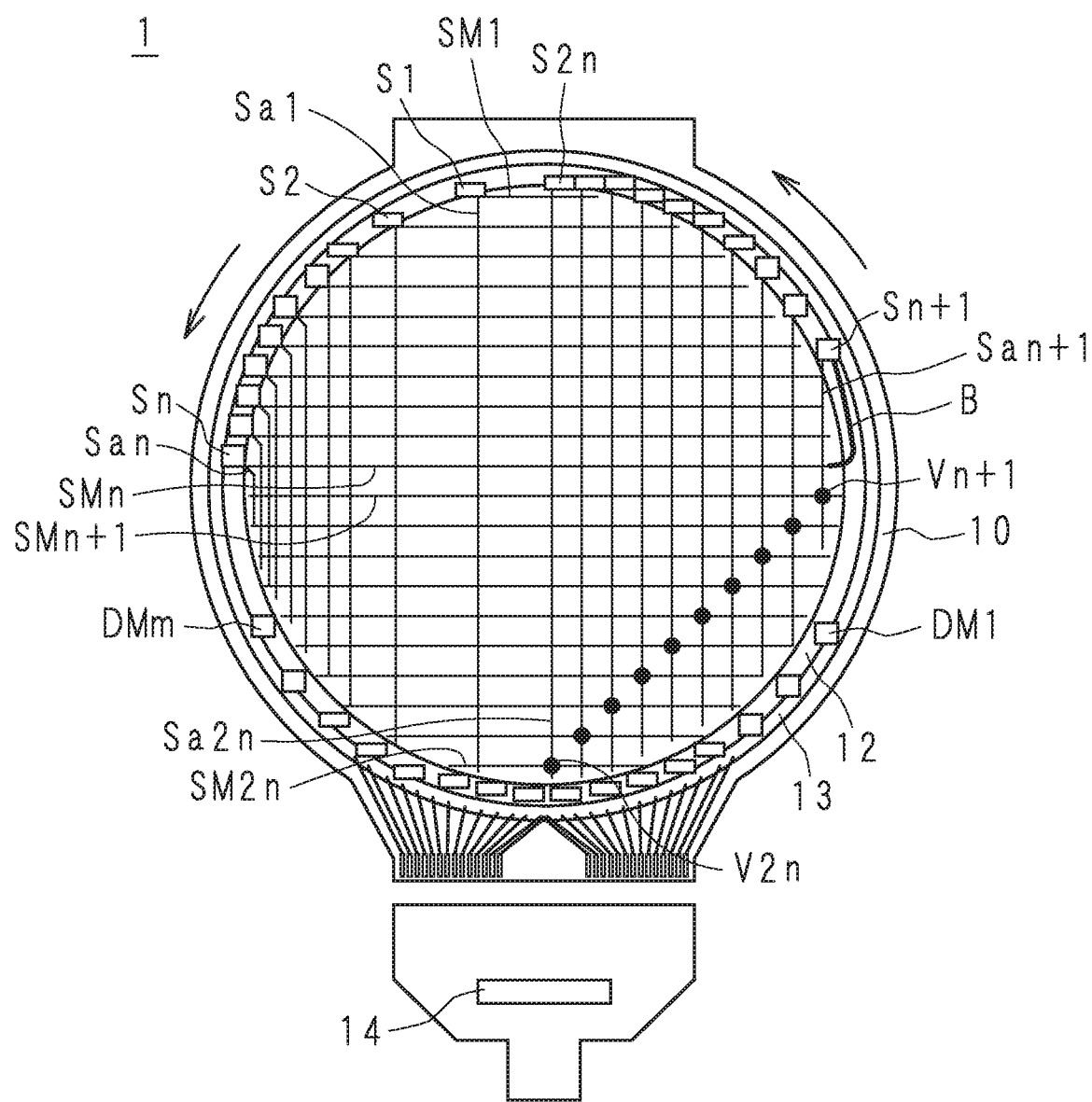
FIG. 11 is a plan view illustrating an arrangement example of scan lines.

FIG. 11 is a plan view illustrating an arrangement example of scan lines. In FIG. 11, the same constituent elements as those of the above-described embodiments will be denoted by the same reference numerals and the description thereof will be omitted. In the present embodiment, the scan driver blocks S1 to Sn are connected to the first wirings SM1 to SMn extending in the first direction, respectively. The first wirings SM1 to SMn correspond to the scan lines SL1 to SLn of the above-described embodiments. The scan driver blocks S1 to Sn are also connected to the second wirings Sa1 to San (third wirings) extending in the second direction, respectively.

The first wiring SM1 is the shortest among the first wirings SM1 to SMn. The first wiring SM2 is longer than the first wiring SM1. The first wiring SM3 is longer than the first wiring SM2. The first wirings SM1, SM2, SM3, . . . , and so on become longer in this order. The first wiring SMn is the longest. On the other hand, the second wiring Sa1 is the longest among the second wirings Sa1 to San. The second wiring Sa2 is shorter than the second wiring Sa1. The second wirings Sa1, Sa2, Sa3, . . . , and so on become shorter in this order. The second wiring San is the shortest. Due to such a configuration, the sum of lengths of the first wiring SM1 and the second wiring Sa1 connected to the scan driver block S1 is approximately the same as the sum of the lengths of the first wiring SM2 and the second wiring Sa2 connected to the scan driver block S2. The sums of the lengths of the first wirings and the second wirings connected to the other scan driver block are approximately the same. Furthermore, the sum of these lengths is approximately the same as the sum of the lengths of the intersecting scan lines SLn+1 to SL2n connected to the scan driver blocks Sn+1 to S2n, respectively. The wirings to which the scan driver blocks S1 to S2n output a scan signal have approximately the same lengths.

The present embodiment provides the following advantages in addition to the advantages provided by the above-described embodiments. Since the wirings to which the scan driver blocks S1 to S2n output a scan signal have approximately the same capacitance, the delay time is approximately the same. As a result, it is possible to suppress a variation in delay time.

Embodiment 5

Figure 12:
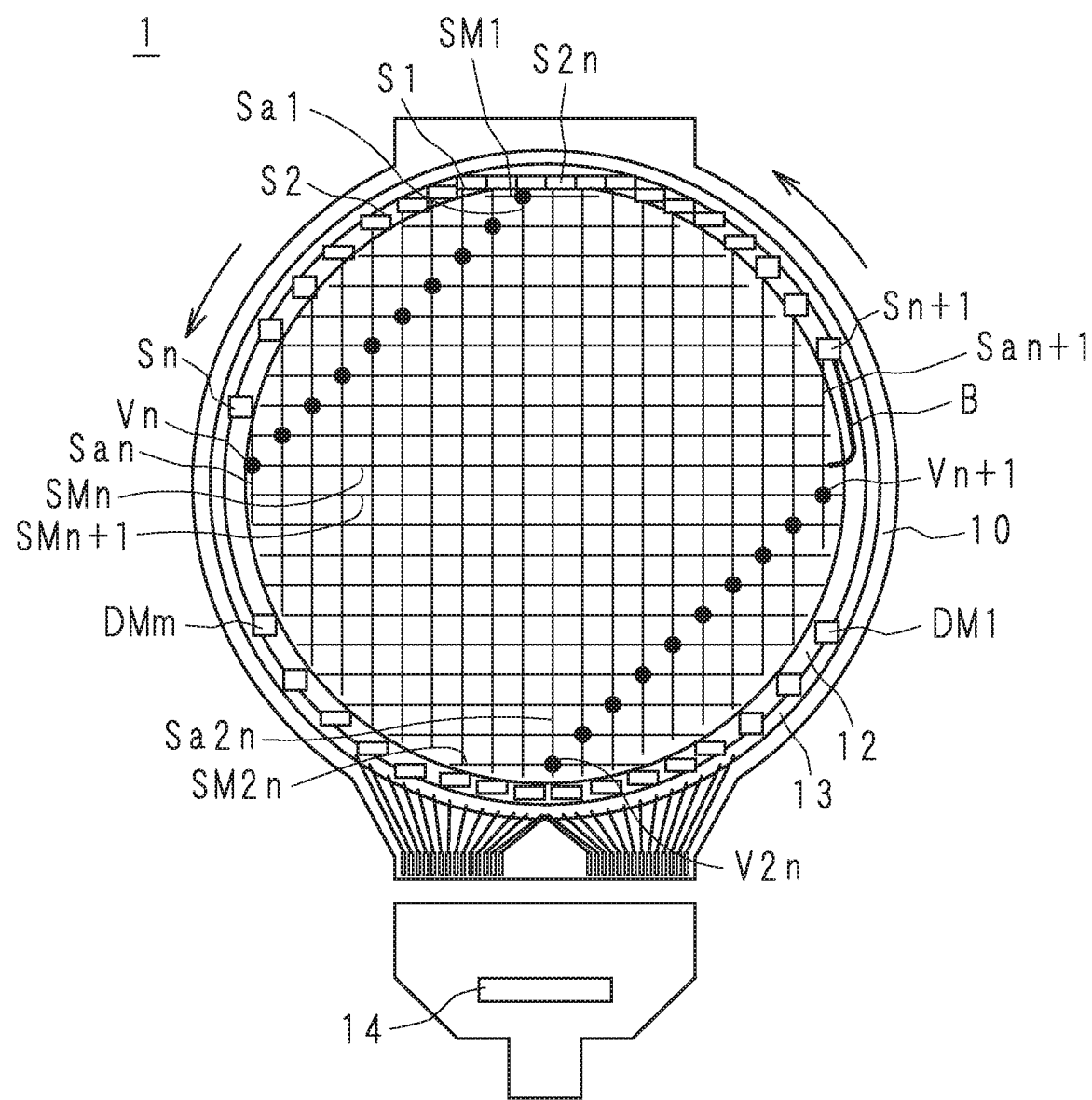
FIG. 12 is a plan view illustrating an arrangement example of scan lines.

The present embodiment relates to a configuration in which all scan lines are intersecting scan lines including the first wirings extending in the first direction and the second wirings extending in the second direction. FIG. 12 is a plan view illustrating an arrangement example of scan lines. In FIG. 12, the same constituent elements as those of the above-described embodiments will be denoted by the same reference numerals and the description thereof will be omitted.

In the present embodiment, the scan line SL1 connected to the scan driver block S1 includes the first wiring SM1 extending in the first direction and the second wiring Sa1 extending in the second direction. The first wiring SM1 and the second wiring Sa1 are connected by a wiring connection portion V1. Similarly, the scan lines SL2 to SLn connected to the scan driver blocks S2 to Sn include the first wirings SM2 to SMn extending in the first direction and the second wirings Sa2 to San extending in the second direction, respectively. The first wirings SM2 to SMn and the second wirings Sa2 to San are connected by the wiring connection portions V2 to Vn, respectively. The intersecting scan lines SLn+1 to SL2n connected to the scan driver blocks Sn+1 to S2n are similar to those of the above-described embodiments.

The first wirings SM1 to SM2n extending in the first direction are connected to a first pixel group arrayed in the first direction. A second pixel group arrayed in the second direction is connected to the data lines extending in the second direction.

Similarly to Embodiment 4, the first wiring SM1 is the shortest among the first wirings SM1 to SMn. The first wiring SMn is the longest. The first wirings SM1, SM2, SM3, . . . , and so on become longer in this order. On the other hand, the second wiring Sa1 is the longest among the second wirings Sa1 to San. The second wiring San is the shortest. The second wirings Sa1, Sa2, Sa3, . . . , and so on become shorter in this order. Due to such a configuration, the scan lines SL1 to SLn are approximately the same length. Similarly, the intersecting scan lines SLn+1 to SL2n have approximately the same length. Moreover, the scan lines SL1 to SL2n have approximately the same length. Due to this, the scan lines have approximately the same wiring capacitance and the delay time becomes approximately the same. As a result, it is possible to suppress a variation in delay time.

The present embodiment provides the following advantages in addition to the advantages provided by the above-described embodiments. Since all scan lines include the first wirings and the second wirings, the second wirings can be arranged uniformly in the first direction. Due to this, it is possible to alleviate the difficulty in arrangement of the second wirings.

Figure 13:
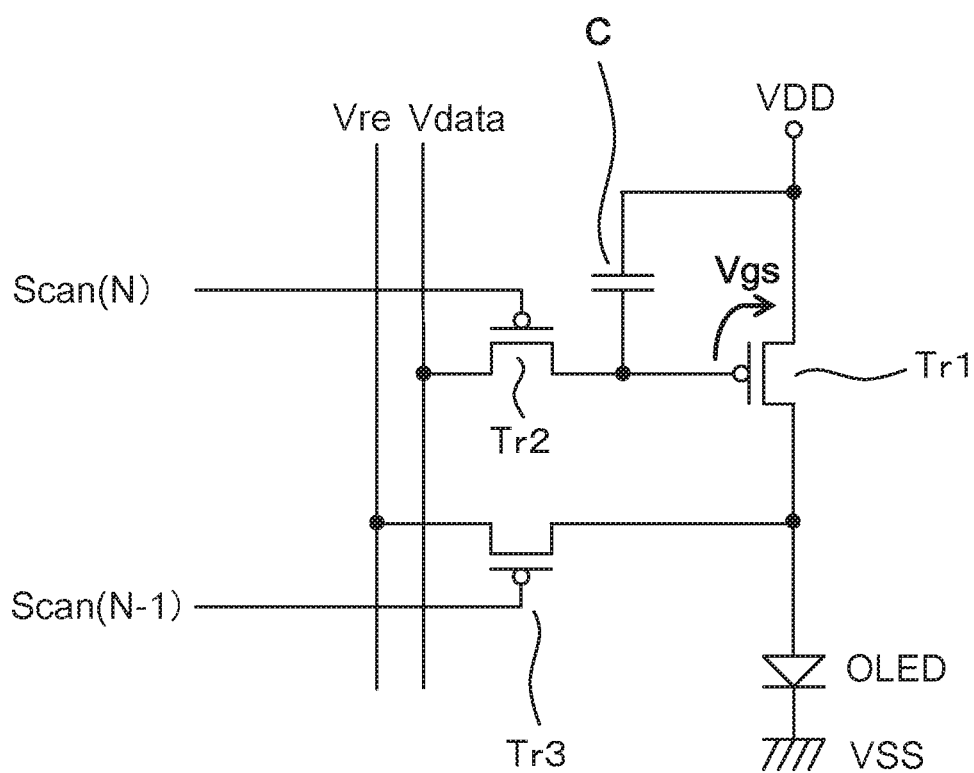
FIG. 13 is a circuit diagram illustrating another example of a pixel circuit included in a pixel.

The pixel circuit is not limited to the circuit illustrated in FIG. 7. FIG. 13 is a circuit diagram illustrating another example of a pixel circuit included in a pixel 111. The pixel circuit includes an OLED, a driving transistor Tr1, a switching transistor Tr2, a reset transistor Tr3, and a retention capacitor C. An output voltage of a positive voltage source VDD, an output voltage of a negative voltage source VSS, a video signal Vdata, a scan signal 1 Scan(N), a scan signal 2 Scan(N−1), and a reset signal Vre are input to the pixel circuit. The video signal Vdata is output from the data driver blocks DM1 to DMm to the corresponding pixel circuits. The scan signal 1 Scan(N) is output from an N-th scan driver block SN. The scan signal 2 Scan(N−1) is output from a (N−1)th scan driver block SN−1.

The video signal Vdata is input to the source electrode of the switching transistor Tr2. The reset signal Vre is input to the source electrode of the reset transistor Tr3.

The scan signal 1 Scan(N) is input to the gate electrode of the switching transistor Tr2. The scan signal 2 Scan(N−1) is input to the gate electrode of the reset transistor Tr3. The positive voltage source VDD is connected to the first electrode of the retention capacitor C and the source electrode of the driving transistor Tr1. The negative voltage source VSS is connected to the cathode electrode of the OLED.

The drain electrode of the switching transistor Tr2 is connected to the second electrode of the retention capacitor C and the gate electrode of the driving transistor Tr1. The drain electrode of the driving transistor Tr1 and the drain electrode of the reset transistor Tr3 are connected to the anode electrode of the OLED.

The video signal Vdata is a voltage which corresponds to the emission luminance of the OLEDs and which ranges between a black potential and a white potential. The difference between the pixel circuit in FIG. 7 and the pixel circuit in FIG. 13 lies in the presence of a function of resetting the anode electrode of the OLED using the reset transistor Tr3. The reset transistor Tr3 is used for stopping emission of the OLED by putting the voltage between the anode electrode and the cathode electrode of the OLED to a zero bias state or a reverse state (the voltage of the anode electrode is lower than the voltage of the cathode electrode) rather than putting the same to a forward state (the voltage of the anode electrode is higher than the voltage of the cathode electrode).

Specifically, the reset transistor Tr3 is turned on by the scan signal 2 Scan(N−1) immediately before the scan signal 1 Scan(N) is turned on. When the reset transistor Tr3 is turned on, the reset signal Vre is applied to the anode electrode of the OLED. The reset signal Vre has the same potential as the potential of the negative voltage source VSS or a lower potential than the potential of the negative voltage source VSS, for example. As a result, the OLED is in a reverse biased region of a diode and does not emit light.

The emission of the OLED is stopped using the reset transistor, and it is therefore possible to lower the black level. Moreover, it is possible to suppress the crosstalk between subpixels which appear frequently.

According to an aspect of the present disclosure, it is possible to narrow the bezel width of a display apparatus having a non-rectangular display region.

Depending on whether the pixel circuit illustrated in FIG. 7 or the pixel circuit illustrated in FIG. 13 is employed, the configuration of the driver IC 14, the data driver blocks DM1 to DMm, and the scan driver blocks S1 to S2n can be changed appropriately. In the pixel circuit illustrated in FIG. 13, two types of scan signals are input to the same pixel circuit (that is, two scan lines are wired in one pixel circuit). Therefore, each of the scan driver blocks S1 to S2n is connected to two scan lines and outputs different signals to the two scan lines. Such a modification is also appropriately possible.

The technical features (constituent elements) described in each embodiment may be combined with one another, and such combinations may form new technical features.

It should be understood that the embodiments disclosed herein are illustrative and not limitative in all aspects. The scope of the present invention is defined not by the foregoing description but by the scope of the claims, and is intended to include meanings equivalent to the scope of the claims and all modifications within the scope.

It is noted that, as used herein and in the appended claims, the singular forms "a", "an", and "the" include plural referents unless the context clearly dictates otherwise.

What is claimed is:

1. A display apparatus comprising:
   a plurality of pixels arrayed in a non-rectangular display region in a first direction and a second direction;
   one or more scan lines extending in the first direction within the display region and connected to a first pixel group extending in the first direction;
   a plurality of intersecting scan lines each including a first wiring and a second wiring, the first wiring extending in the first direction within the display region and connected to a second pixel group extending in the first direction, the second wiring extending in the second direction within the display region;
   one or more data lines extending in the second direction within the display region and connected to a third pixel group extending in the second direction;
   a plurality of scan circuits disposed along an outer circumference of the display region without concentrating in a partial region of the display region and directly connected to the one or more scan lines and to the second wirings of the plurality of intersecting scan lines respectively, and configured to output a scan signal to a scan line of the one or more scan lines and to output a scan signal to the first wiring via the second wiring of an intersecting scan line of the plurality of intersecting scan lines; and
   a plurality of data signal circuits disposed along the outer circumference without concentrating in a partial region of the display region, and configured to output to the data line a data signal corresponding to an emission luminance of a pixel to which the scan signal is input,
   wherein the display region is divided into first to fourth substantially symmetric and equal quadrants, the outer circumference is divided into a first side portion which is an outer circumference of the first and second quadrants and a second side portion which is an outer circumference of the third and fourth quadrants,
   the one or more scan lines are disposed to extend in the first direction in two of the first to fourth quadrants, the first wirings of the plurality of intersecting scan lines are disposed to extend in the first direction in two of the first to fourth quadrants, other than the two of the first to fourth quadrants in which the one or more scan lines are disposed to extend, the second wirings of the plurality of intersecting scan lines are disposed to extend in the second direction in two of the first to fourth quadrants, and the one or more data lines are disposed to extend in the second direction in the first to fourth quadrants, and total lengths of the first and second wirings of the plurality of intersecting scan lines are approximately the same.

2. The display apparatus according to claim 1, wherein the one or more scan lines include first to p-th (p is an integer of 2 or more) scan lines, the plurality of intersecting scan lines include first to q-th (q is an integer of 2 or more) intersecting scan lines, the first to p-th scan lines are disposed adjacent to each other in the second direction, the first wirings of the first to q-th intersecting scan lines are disposed adjacent to each other in the second direction, the plurality of scan circuits include at least (p+q) scan circuits, the first side portion includes a third side portion and a fourth side portion facing both of the third side portion and the second wiring, the first to p-th scan circuits are disposed in the third side portion and are electrically connected to the first to p-th scan lines, respectively, and the (p+1)-th to (p+q)-th scan circuits are disposed in the fourth side portion and are electrically connected to the second wirings of the first to q-th intersecting scan lines, respectively.

3. The display apparatus according to claim 2, wherein a length of the second wiring of an i-th (i is an integer of 1 or more and smaller than q) intersecting scan line is shorter than a length of the second wiring of an (i+1)th intersecting scan line, and a length of the first wiring of the i-th intersecting scan line is longer than a length of the first wiring of the (i+1)th intersecting scan line.

4. The display apparatus according to claim 3, wherein the first to p-th scan lines are disposed in the first and second quadrants, and the first wirings of the first to q-th intersecting scan lines are disposed in the third and fourth quadrants.

5. The display apparatus according to claim 4, wherein the third side portion is the outer circumference of the second quadrant of the display region, and the fourth side portion is the outer circumference of the first quadrant of the display region.

6. The display apparatus according to claim 3, wherein the scan circuit that outputs the scan signal to the p-th scan line outputs a timing signal indicating a scan start timing via the p-th scan line to the scan circuit that outputs the scan signal to the first intersecting scan line.

7. The display apparatus according to claim 1, wherein the pixel includes a light emitting device including an organic light emitting layer and a pixel circuit including a capacitor and a driving transistor that allows a current corresponding to a voltage of the capacitor to flow into the light emitting device, the pixel circuit includes at least a first layer and a second layer, and is formed on a substrate, the light emitting device is formed on an upper side of the pixel circuit, the first layer includes the second wiring, the data line and a wiring connected to at least one of a source and a drain of the driving transistor, and the second layer includes a metal electrode of the capacitor, the scan line and the first wiring.

8. The display apparatus according to claim 1, wherein the pixel includes a light emitting device including an organic light emitting layer and a pixel circuit including a capacitor and a driving transistor that allows a current corresponding to a voltage of the capacitor to flow into the light emitting device, the pixel circuit includes at least first to third layers, and is formed on a substrate, the light emitting device is formed on an upper side of the pixel circuit, the first layer includes the data line and a wiring connected to at least one of a source and a drain of the driving transistor, the second layer includes the scan line, the first wiring and a first metal electrode of the capacitor, and the third layer includes the second wiring and a second metal electrode of the capacitor.

9. The display apparatus according to claim 1, wherein the scan line further includes a third wiring that extends in the second direction.

10. The display apparatus according to claim 1, wherein the plurality of intersecting scan lines includes a connection portion connecting the first wiring to the second wiring and the connection portion is arranged within the display region, and the first pixel group is arranged between the scan circuit connected to the scan line and the scan circuits connected to the second wirings of the plurality of intersecting scan lines.

11. A display apparatus comprising:

a plurality of pixels arrayed in a non-rectangular display region in a first direction and a second direction;

a plurality of intersecting scan lines each including a first wiring and a second wiring, the first wiring extending in the first direction within the display region and connected to a first pixel group extending in the first direction, the second wiring extending in the second direction within the display region;

one or more data lines extending in the second direction within the display region and connected to a second pixel group extending in the second direction;

a plurality of scan circuits disposed along an outer circumference of the display region without concentrating in a partial region of the display region and directly connected to the second wirings of the plurality of intersecting scan lines respectively, and configured to output a scan signal to the first wiring via the second wiring of an intersecting scan line of the plurality of intersecting scan lines; and a plurality of data signal circuits disposed along the outer circumference without concentrating in a partial region of the display region, and configured to output to the data line a data signal corresponding to an emission luminance of a pixel to which the scan signal is input, wherein the display region is divided into first to fourth substantially symmetric and equal quadrants, the outer circumference is divided into a first side portion which is an outer circumference of the first and second quadrants and a second side portion which is an outer circumference of the third and fourth quadrants, the first wirings of the plurality of intersecting scan lines are disposed to extend in the first direction in the first to fourth quadrants, the second wirings of the plurality of intersecting scan lines are disposed to extend in the second direction in the first to fourth quadrants, and the one or more data lines are disposed to extend in the second direction in the first to fourth quadrants, and total lengths of the first and second wirings of the plurality of intersecting scan lines are approximately the same.

12. The display apparatus according to claim 11, wherein the plurality of intersecting scan lines include first to n-th (n is an integer of 2 or more) intersecting scan lines,
the first wirings of the first to n-th intersecting scan lines are disposed adjacent to each other in the second direction,
the plurality of scan circuits include at least n scan circuits,
first to m-th (m is an integer of 1 or more and smaller than n) scan circuits are disposed to correspond to the second wirings of the first to m-th intersecting scan lines so that positions of the first to m-th scan circuits in the first direction are arranged sequentially from an inner side to an outer side and positions of the first to m-th scan circuits in the second direction are arranged sequentially from an outer side to an inner side, and
the (m+1)th to n-th scan circuits are disposed to correspond to the second wirings of the (m+1)th to n-th intersecting scan lines so that positions of the (m+1)th to n-th scan circuits in the first direction are arranged sequentially from an outer side to an inner side and positions of the (m+1)th to n-th scan circuits in the second direction are arranged sequentially from an inner side to an outer side.

13. The display apparatus according to claim 12,
wherein a length of the second wiring of an i-th (i is an integer of 1 or more and m or smaller) intersecting scan line is longer than a length of the second wiring of an (i+1)th intersecting scan line, and a length of the first wiring of the i-th intersecting scan line is shorter than a length of the first wiring of the (i+1)th intersecting scan line, and
a length of the second wiring of a j-th (j is an integer of m+1 or more and smaller than n) intersecting scan line is shorter than a length of the second wiring of a (j+1)th intersecting scan line, and a length of the first wiring of the j-th intersecting scan line is longer than a length of the first wiring of the (j+1)th intersecting scan line.

14. The display apparatus according to claim 13,
wherein the first wirings of the first to m-th intersecting scan lines are disposed in the first and second quadrants, and
the first wirings of the (m+1)th to n-th intersecting scan lines are disposed in the third and fourth quadrants.

15. The display apparatus according to claim 14,
wherein the first to m-th scan circuits are disposed along the outer circumference of the second quadrant of the display region, and
the (m+1)th to n-th scan circuits are disposed along the outer circumference of the first quadrant of the display region.

16. The display apparatus according to claim 11,
wherein the pixel includes a light emitting device including an organic light emitting layer and a pixel circuit including a capacitor and a driving transistor that allows a current corresponding to a voltage of the capacitor to flow into the light emitting device,
the pixel circuit includes at least a first layer and a second layer, and is formed on a substrate,
the light emitting device is formed on an upper side of the pixel circuit,
the first layer includes the second wiring, the data line and a wiring connected to at least one of a source and a drain of the driving transistor, and
the second layer includes a metal electrode of the capacitor and the first wiring.

17. The display apparatus according to claim 11,
wherein the pixel includes a light emitting device including an organic light emitting layer and a pixel circuit including a capacitor and a driving transistor that allows a current corresponding to a voltage of the capacitor to flow into the light emitting device,
the pixel circuit includes at least first to third layers, and is formed on a substrate,
the light emitting device is formed on an upper side of the pixel circuit,
the first layer includes the data line and a wiring connected to at least one of a source and a drain of the driving transistor,
the second layer includes the first wiring and a first metal electrode of the capacitor, and
the third layer includes the second wiring and a second metal electrode of the capacitor.

18. The display apparatus according to claim 11,
wherein the plurality of intersecting scan lines includes a connection portion connecting the first wiring to the second wiring and the connection portion is arranged within the display region, and
at least a portion of pixels of the second pixel group is arranged between first to m-th (m is an integer of 1 or more and smaller than n) scan circuits included in the plurality of scan circuits and the (m+1)th to n-th scan circuits included in the plurality of scan circuits.

* * * * *